(12) United States Patent
Singh et al.

(10) Patent No.: US 6,455,332 B1
(45) Date of Patent: *Sep. 24, 2002

(54) METHODOLOGY TO MITIGATE ELECTRON BEAM INDUCED CHARGE DISSIPATION ON POLYSILICON FINE PATTERNING

(75) Inventors: Bhanwar Singh, Morgan Hill; Michael Templeton, Atherton, both of CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/564,406

(22) Filed: May 1, 2000

(51) Int. Cl.$^7$ .......................... H01L 21/00; H01L 21/66; G21K 5/00

(52) U.S. Cl. .......................... 438/5; 438/14; 250/492.3

(58) Field of Search .................... 438/5, 7, 10, 11, 438/14, 16, 17, 18; 250/492.1, 492.2, 492.22, 492.3; 257/48; 324/751

(56) References Cited

U.S. PATENT DOCUMENTS

| 4,871,962 A | * 10/1989 | Cheung ...................... 324/699 |
| 4,923,301 A | 5/1990 | White |
| 4,929,083 A | 5/1990 | Brunner |
| 5,362,585 A | 11/1994 | Adams |
| 5,674,652 A | 10/1997 | Bishop et al. |
| 5,736,863 A | * 4/1998 | Liu ........................... 324/765 |
| 5,830,611 A | 11/1998 | Bishop et al. |
| 5,962,867 A | * 10/1999 | Liu ............................ 257/48 |

OTHER PUBLICATIONS

Laplante, Comprehensive Dictionary of Electrical Engineering, 1999, IEEE Press, p. 292.*

* cited by examiner

Primary Examiner—Michael Sherry
Assistant Examiner—Evan Pert
(74) Attorney, Agent, or Firm—Amin & Turocy, LLP

(57) ABSTRACT

A method of making and using a reference wafer and a metrology system to calibrate tools in a photolithographic system. The reference wafer includes a silicon substrate, a dielectric or insulating layer disposed above the silicon substrate and a pattern disposed above the insulating layer. The pattern is coupled to the silicon substrate and the silicon substrate acts as a ground for the pattern. As a result, charge buildup on the pattern is mitigated since excess charge is dissipated into the silicon substrate.

10 Claims, 7 Drawing Sheets

METHODOLOGY TO MITIGATE ELECTRON BEAM INDUCED CHARGE DISSIPATION ON POLYSILICON FINE PATTERNING

TECHNICAL FIELD

The present invention generally relates to semiconductor processing, and in particular to a method for improving a process for calibrating a photolithographic tool.

BACKGROUND OF THE INVENTION

In the semiconductor industry, there is a continuing trend toward higher device densities. To achieve these high densities there has been and continues to be efforts toward scaling down device dimensions at submicron levels on semiconductor wafers. In order to accomplish such high device packing density, smaller and smaller feature sizes are required. This may include the width and spacing of interconnecting lines and the surface geometry such as corners and edges of various features.

The requirement of small features with close spacing between adjacent features requires high resolution photolithographic processes. In general, lithography refers to processes for pattern transfer between various media. It is a technique used for integrated circuit fabrication in which a silicon slice, the wafer, is coated uniformly with a radiation-sensitive film, the resist, and an exposing source (such as optical light, x-rays, or an electron beam) illuminates selected areas of the surface through an intervening master template, the mask, for a particular pattern. The lithographic coating is generally a radiation-sensitive coating suitable for receiving a projected image of the subject pattern. Once the image is projected, it is indelibly formed in the coating. The projected image may be either a negative or a positive of the subject pattern. Exposure of the coating through a photomask causes the image area to become either more or less soluble (depending on the coating) in a particular solvent developer. The more soluble areas are removed in the developing process to leave the pattern image in the coating as less soluble polymer.

FIGS. 1a and 1b illustrate problems associated with conventional polysilicon gate layer test wafers. FIG. 1a illustrates a reference wafer 10 having a pattern 15 formed thereon. The pattern 15 could include a plurality of fields, each field having an array of sub-fields and each sub-field having a number of component images formed thereon. FIG. 1b illustrates a portion of the reference wafer 10 including a silicon substrate layer 12, a dielectric or insulating layer 14 on the silicon substrate layer 12, and a first contact 16 and a second contact 18 on the insulating layer 14. The first contact 16 and the second contact 18 are made of a conductive material, such as polysilicon or metal. In a metrology measurement system, electron beams 20 are directed toward the reference wafer 10 and secondary electron emissions from the surface are detected by detectors (not shown). However, a charge 22 begins forming on the first contact 16 and the second contact 18 from the electron beams 20 due to the conductivity of the contacts. The charge build up 22 may cause deflection in the incident beam in addition to deflection and/or suppression of the secondary electron emissions.

In view of the above, an improvement of the calibration process is needed. In addition an improvement is needed in the structure and formation of the reference wafer.

SUMMARY OF THE INVENTION

The present invention provides for an improved method of making and using a reference wafer to calibrate metrology tools. Reference wafers are used in SEM to make precision and line width measurements repeatedly in order to maintain the tools in accordance with desired specifications. An electron beam may cause a charge buildup on an area of inspection pattern on the reference wafer if the elements and materials are not connected to a ground, as opposed to actual production wafers. This charge buildup may cause deflection of an incident electron beam and deflection and/or suppression of secondary electron emission resulting in erroneous secondary electron signals from the reference wafer.

The reference wafer of the present invention includes a silicon substrate, a dielectric or insulating layer disposed above the silicon substrate and a material (polysilicon, silicon nitride, metal, amorphous silicon) disposed above the insulating layer. The features (e.g., lines) are formed so that they extend through the insulating layer to the silicon substrate. The silicon substrate acts as a ground for the elements or materials forming the pattern (it is to be appreciated that an ion implantation may be performed to modify the electron dissipation properties of the base silicon to be more electron conductive). As a result, charge that is formed on the patterned layer due to charges induced by the electron beam dissipate into the silicon substrate thereby mitigating deleterious charge formation on the patterned layer.

In one aspect of the invention a reference wafer for calibrating a metrology tool set is provided. The reference wafer includes a substrate layer, an insulating layer formed over the substrate layer, a pattern formed over the insulating layer and at least one conductive path coupling at least a portion of the pattern to the substrate layer. The at least one conductive path provides a path to dissipate charge from the at least a portion of the pattern to the substrate layer.

In yet another aspect of the invention a method for calibrating a line width measurement metrology tool set over time is provided. The method includes the steps of using a reference wafer to calibrate the tool at a first time period, the reference wafer, including a substrate layer, an insulating layer formed over the substrate layer, a pattern formed over the insulating layer, and at least one conductive path coupling at least a portion of the pattern to the substrate layer, the at least one conductive path providing a path to dissipate charge from the at least a portion of the pattern to the substrate layer, and using the reference wafer to calibrate the tool at a second time period.

In another aspect of the invention a method for calibrating first and second metrology tool sets is provided. The method includes the steps of using a reference wafer to calibrate the first tool, the reference wafer, including a substrate layer, an insulating layer formed over the substrate layer, a pattern formed over the insulating layer, and at least one conductive path coupling at least a portion of the pattern to the substrate layer, the at least one conductive path providing a path to dissipate charge from the at least a portion of the pattern to the substrate layer and using the reference wafer to calibrate the second tool at a second time period.

One aspect of the invention relates to a SEM system. The system includes a line width measurement metrology tool set and a reference wafer adapted to be used to calibrate the tool. The reference wafer includes a silicon layer, an insulating layer above the silicon layer and at least one contact. The contact extends from the top of the silicon layer to above the top of the insulating layer. The system also includes a metrology system adapted to transmit an electron beam to the reference wafer and detect electron emissions based on characteristics of the reference wafer. The electron beam from the metrology system making contact with the at least one contact forms a charge on the at least one contact that dissipates through the silicon layer.

Another aspect of the present invention relates to a reference wafer for calibrating a line width measurement metrology tool set. The reference wafer includes a silicon layer, an insulating layer above the silicon layer and at least one contact. The contact extends from the top of the silicon layer to above the top of the insulating layer wherein an electron beam transmitted from a metrology system and making contact with the at least one contact forms a charge on the at least one contact that dissipates through the silicon layer.

Yet another aspect of the present invention provides for a method of fabricating a reference wafer. The method includes the steps of providing a substrate having an insulating layer, providing a photoresist layer over the insulating layer, developing the photoresist layer exposing portions of the insulating layer, etching the exposed portions of the insulating layer to form at least one via, stripping off the photoresist layer, filling the via with a conductive layer, the conductive layer covering the insulating layer, providing a second photoresist layer over the conductive layer, developing the second photoresist layer exposing portions of the conductive layer, etching the exposed portions of the insulating layer to form at least one contact and stripping off the second photoresist layer.

In yet another embodiment of the invention, a method for calibrating a line width measurement metrology tool set is provided. The method includes the steps of providing a reference wafer adapted to be used to calibrate the tool, the reference wafer having a silicon layer, an insulating layer above the silicon layer and at least one contact, the contact extending from the top of the silicon layer to above the top of the insulating layer, providing a metrology system adapted to transmit an electron beam to the reference wafer and detect secondary electron emissions based on characteristics of the reference wafer, wherein the electron beam transmitted from the metrology system and making contact with the at least one contact forms a charge on the at least one contact that dissipates through the silicon layer, providing a line width measurement metrology tool set coupled to the metrology system, transmitting an electron beam to the reference wafer from the metrology system and measuring the secondary electron emissions from the reference wafer and generating calibration data based on the characteristics of the reference wafer detected from the secondary electron emissions and adjusting the line width measurement metrology tool set based on the calibration data.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1A:
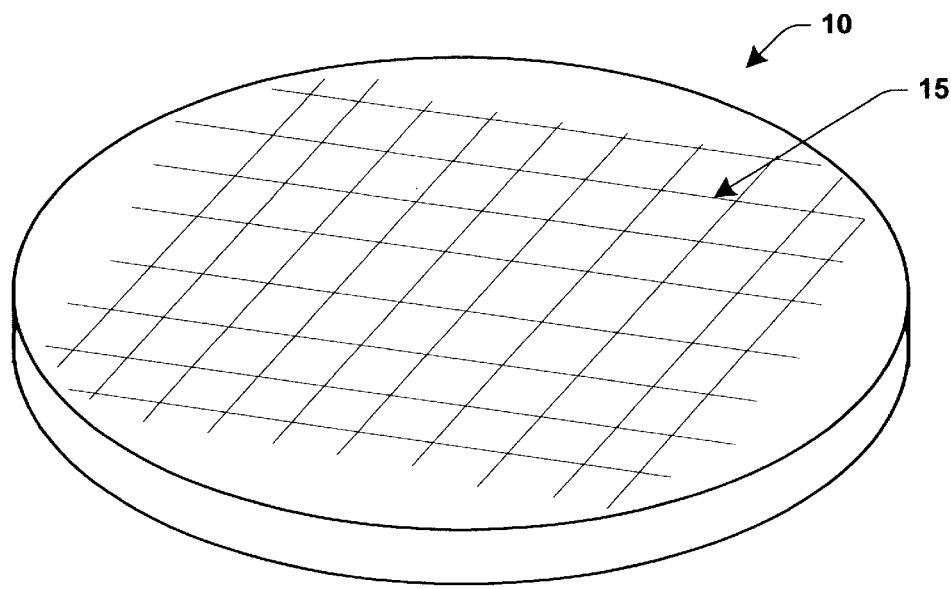
FIG. 1a is a perspective view of a reference wafer including a pattern in accordance with the prior art.
Figure 1B:
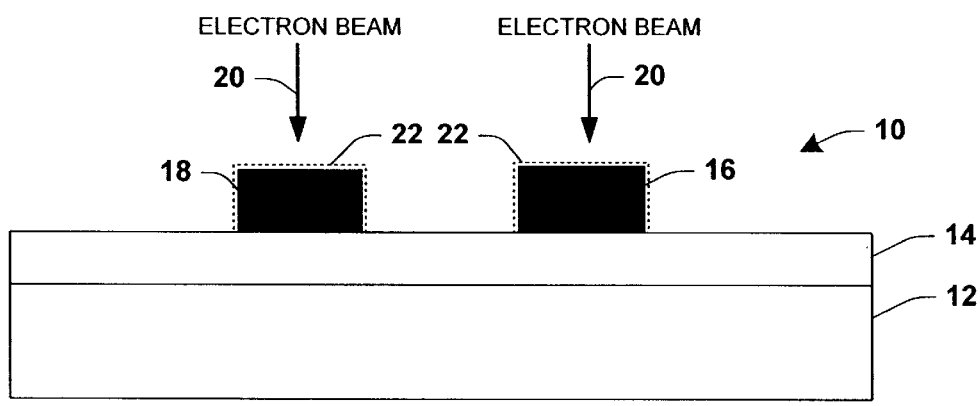
FIG. 1b is a schematic illustration of a portion of the reference wafer of FIG. 1a in accordance with a conventional calibration process.

The present invention will now be described with reference to the drawings, wherein like reference numerals are used to refer to like elements throughout. The present invention involves making and using a reference wafer having a variety of attributes (e.g. reference marks, conductive components) in a metrology process to calibrate various tools used in the lithographic process. The present invention more specifically involves making and using a reference wafer to calibrate a line width measurement metrology tool set.

It is also appreciated that the present invention can be employed to calibrate a single system or tool or several systems or tools in a metrology system. In addition, data obtained for one tool or system in a multiple tool system can be used for calibrating other tools or systems in a metrology system. Calibration using the present invention can also be employed for calibrating a single tool or system over different periods of time.

Figure 2A:
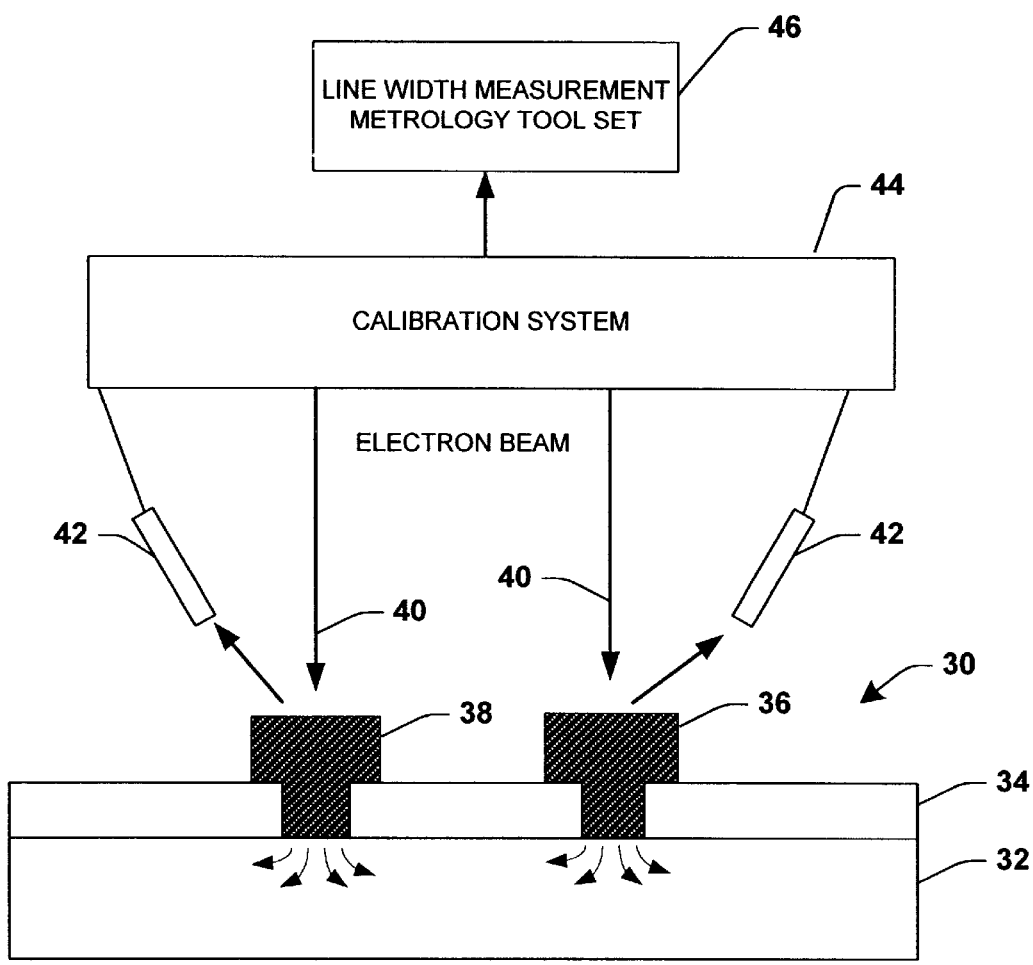
FIG. 2a is a schematic illustration of a calibration system for calibrating a microscope and a tool using a reference wafer in accordance with the present invention.

Referring now to FIG. 2a, a system for calibrating a tool is illustrated including a calibration system 44, a pair of electron detectors 42, a line width measurement metrology tool set 46 and a reference wafer 30. Electron beams 40 are directed at the reference wafer 30 from the calibration system 44. The electron beams 40 will induce secondary electron emission which will deflect off the reference wafer 30 to the electron detectors 42 coupled to the calibration system 44. During scanning by the incident electron scan. a secondary electron emission takes place which is used by the detector 42 to form an image. In the case where the number of incident electrons are greater than that of the secondary emission, charge may start to build on the features. The build-up charge may suppress and/or deflect a secondary emission path for the secondary electrons to reach the detector 42. Broadening or suppression of the signal may lead to erroneous readings. The incident electron beams 40 will begin forming a charge on the first contact 36 and the second contact 38. However, the contacts are electrically coupled to the semiconductor substrate 32, which acts as a ground for the contacts. Therefore, the charge formed on the contacts dissipates through the semiconductor substrate 32 and the secondary electron emission will not be disturbed or suppressed due to the charge. It is to be appreciated that the electron detectors 42 can be replaced by detectors used in calibrating the line width measurement metrology tool set 46 or the detectors could be used to calibrate the electron detectors 42. A variety of calibration setups is contemplated by the present invention which would be apparent to those skilled in the art.

Figure 2B:
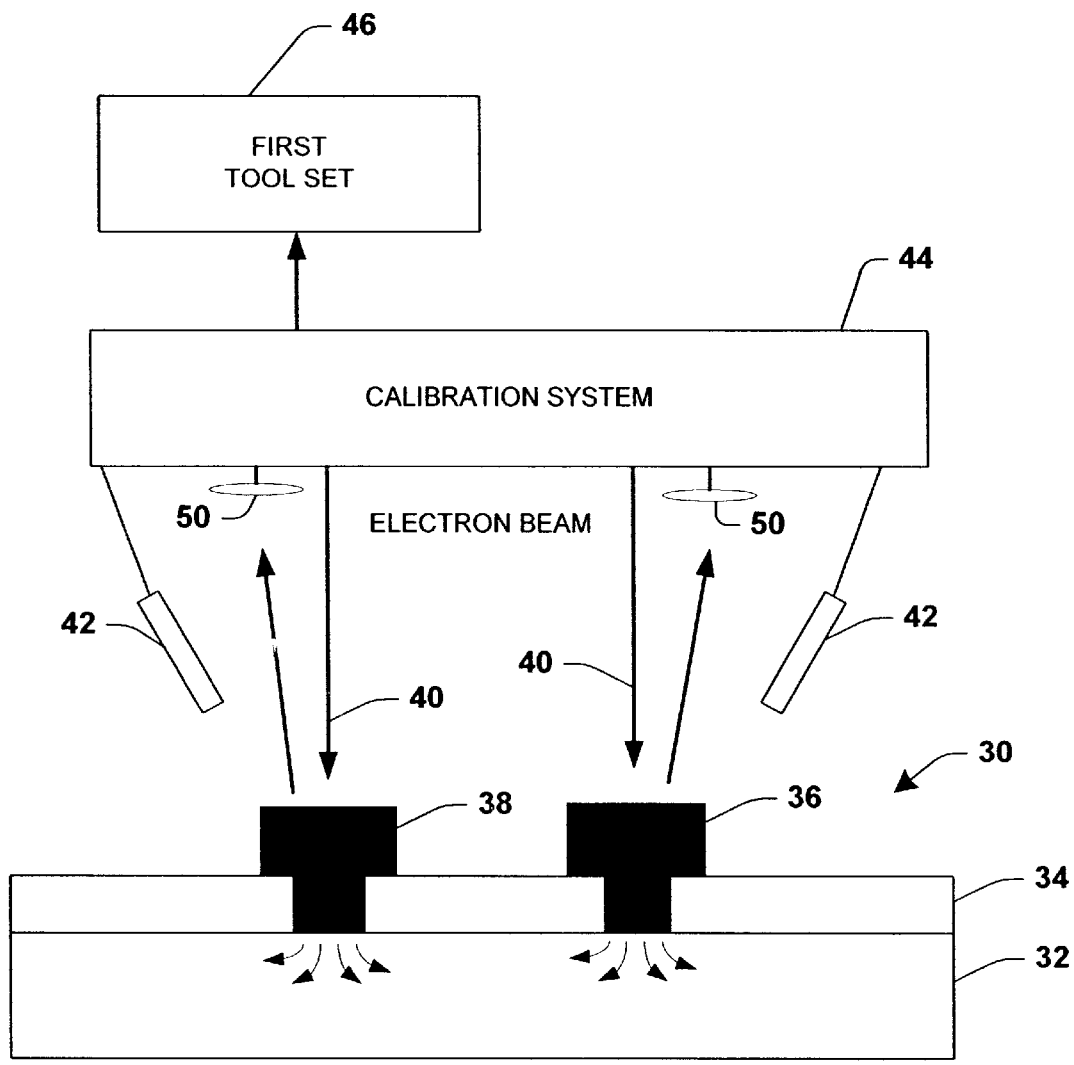
FIG. 2b is a schematic illustration of a calibration system for calibrating a microscope and two tools using a reference wafer in accordance with the present invention.
Figure 3:
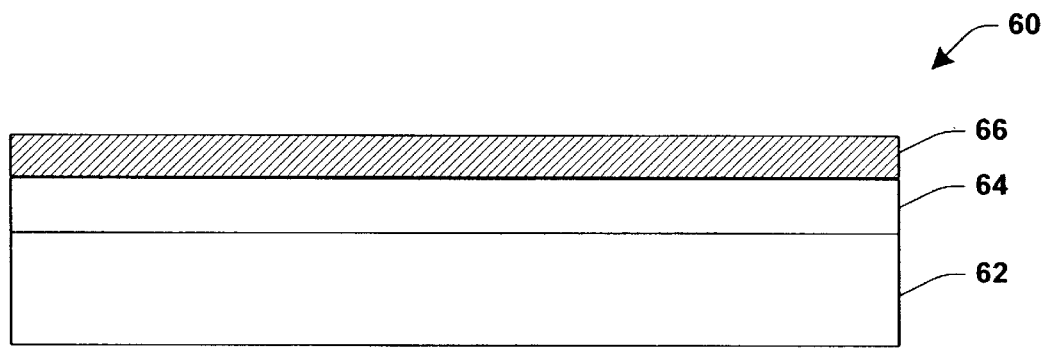
FIG. 3 is a schematic illustration of a semiconductor substrate covered with an insulating layer and a photoresist layer in accordance with the present invention.

Referring now to FIG. 2b, a system for calibrating a tool 46 (it is to be appreciated that a second tool may be employed) is illustrated including the calibration system 44, the pair of electron detectors 42, the reference wafer 30 and a pair of detectors 50 for receiving emissions from the electron beams 40. Electron beams 40 are directed at the reference wafer 30 from the calibration system 44. The electron beams 40 will induce a secondary electron emission that is deflected off the reference wafer 30 to the detectors 50 coupled to the calibration system 44. The emissions will be evaluated into calibration data used in calibrating the electron detectors 42, and the tool 46. The electron beams 40 will begin forming a charge on the first contact 36 and the second contact 38. However, the contacts are electrically coupled to the semiconductor substrate 32, which acts as a ground for the contacts. Therefore, the charge formed on the contacts dissipates through the semiconductor substrate 32 and the secondary electron emission will not disturbed or suppressed due to the charge. It is to be appreciated that the calibration data can include calibration data with respect to the electron detector(s) that is different with respect to each tool. The separate calibration data can be used to cross reference each tool with respect to the other.

FIGS. 3–13 illustrate an embodiment of the present invention. With regard to the description in connection with the embodiment of FIGS. 3–13, the term substrate includes not only a semiconductor substrate, but also any and all layers and structures fabricated over the semiconductor substrate up to FIG. 2 illustrates a non-patterned portion of a reference wafer 60 including an insulating layer (e.g., an oxide layer) 64 which is formed on a semiconductor substrate 62. Semiconductor substrate 62 may be any suitable semiconductor material, for example, a monocrystalline silicon substrate. Any suitable technique (e.g., thermal oxidation, plasma enhanced chemical vapor deposition (CVD), thermal enhanced CVD and spin on techniques) may be employed in forming the insulating layer 64.

Figure 4:
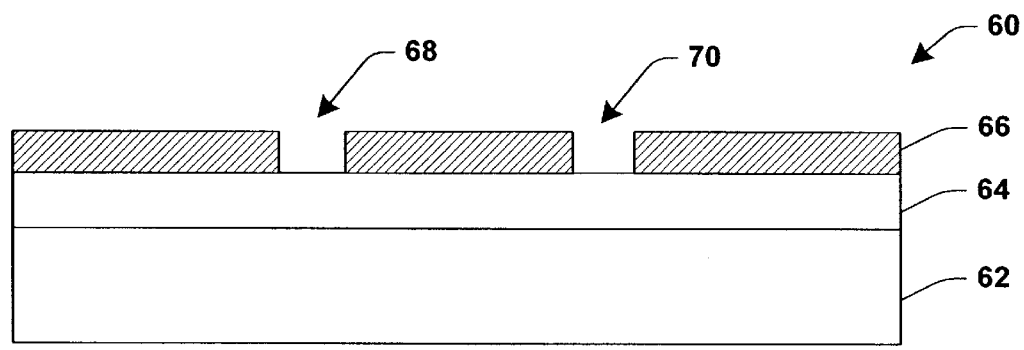
FIG. 4 is a schematic illustration of the structure of FIG. 3 after the photoresist layer has been patterned in accordance with the present invention.

A photoresist layer is formed on the insulating layer 64. The photoresist layer 66 has a thickness suitable for functioning as a mask for etching the underlying insulating layer 64 and for forming patterns or openings in the developed photoresist layer 66. The photoresist layer 66 is patterned using conventional techniques to form a first opening 68 and a second opening 70 (FIG. 4). The size of the first opening 68 and the size of the second opening 70 is about the size of the ultimate vias to be formed in the insulating layer 66. The patterned photoresist 66 serves as an etch mask layer for processing or etching the underlying insulating layer 64.

Figure 5:
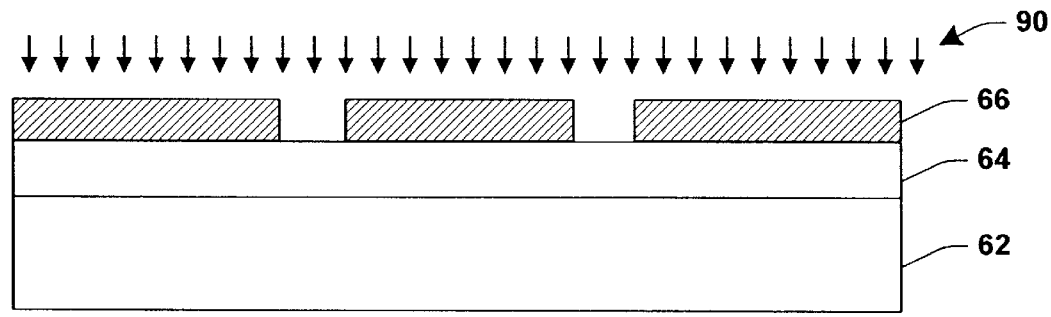
FIG. 5 is a schematic illustration of the structure of FIG. 4 undergoing an etching step in accordance with the present invention.

Turning now to FIG. 5, the insulating layer 64 is shown undergoing an etching process 90 wherein the patterned photoresist layer 66 serves as a mask. For example, the etching process 90 may include a reactive ion etch (RIE), that is highly selective to the insulating layer 64 with respect to the patterned resist layer 66. It is to be appreciated that any suitable etch methodology for selectively etching the insulating layer 64 over the patterned photoresist layer 66 may be employed and is intended to fall within the scope of the hereto appended claims. For example, the insulating layer 64 at the first opening 68 and the second opening 70 is anisotropically etched with a plasma gas(es), herein carbon tetrafluoride ($CF_4$) containing fluorine ions, in a commercially available etcher, such as a parallel plate RIE apparatus or, alternatively, an electron cyclotron resonance (ECR) plasma reactor to replicate the mask pattern of the patterned photoresist layer 66 to thereby create a first via 72 and a second via 74 in the insulating layer 64 (FIG. 6).

Figure 6:
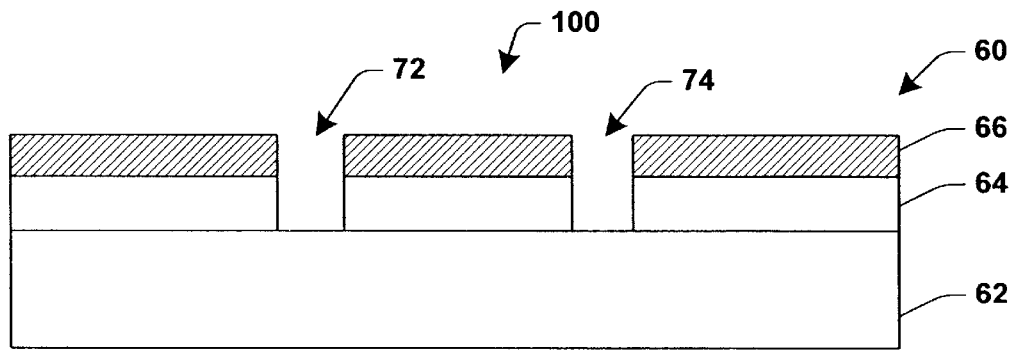
FIG. 6 is a schematic illustration of the structure of FIG. 5 after the etching step is substantially complete in accordance with the present invention.
Figure 7:
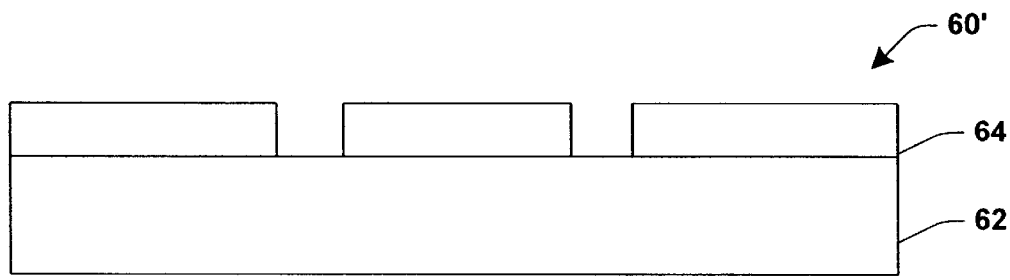
FIG. 7 is a schematic illustration of the structure of FIG. 6 undergoing a stripping step to remove excess photoresist in accordance with the present invention.
Figure 8:
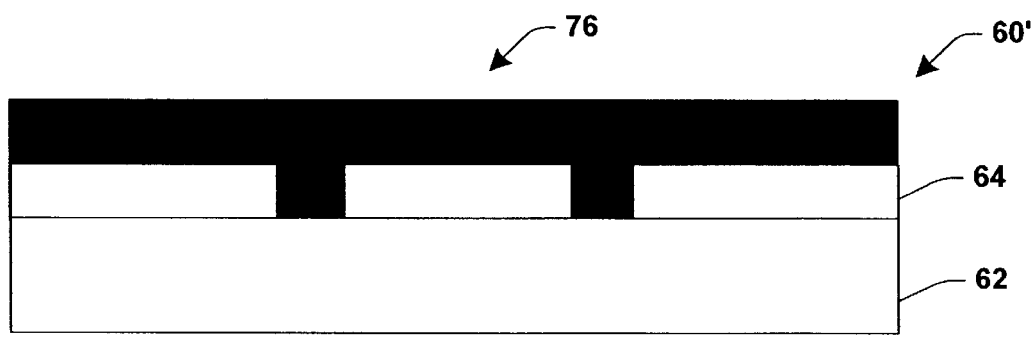
FIG. 8 is a schematic illustration of the structure of FIG. 7 undergoing a contact fill step to form a conductive layer in accordance with the present invention.

FIG. 6 also illustrates a stripping step 100 (e.g., ashing in an $O_2$plasma) to remove remaining portions of the photoresist layer 66. FIG. 7 illustrates a partially complete reference wafer 60' after the stripping step 100 is substantially complete. Next, a deposition step is performed on the structure 60' (FIG. 8) to form a conductive layer 76 over the structure 60'. Preferably, the conductive layer 76 is comprised of polysilicon or metal.

Figure 9:
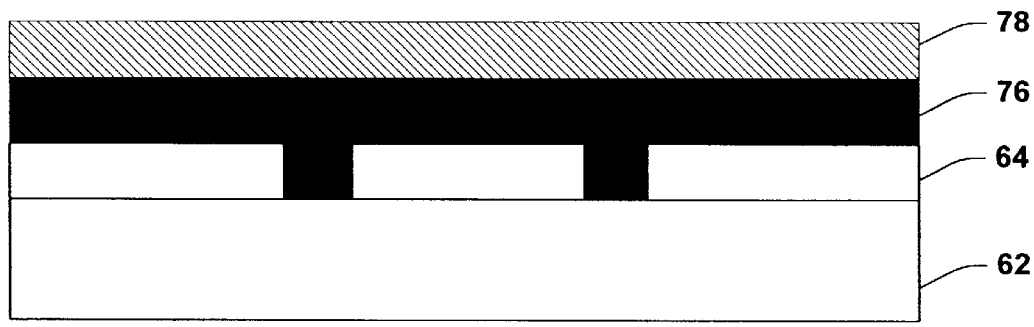
FIG. 9 is a schematic illustration of the structure of FIG. 8 after a second photoresist layer is applied onto the conductive layer in accordance with the present invention.

FIG. 9 illustrates a second photoresist layer 78 formed on the conductive layer 76. The second photoresist layer 78 has a thickness of about 500 Å–5000 Å, however, it is to be appreciated that the thickness thereof may be of any dimension suitable for carrying out the present invention. Accordingly, the thickness of the second photoresist layer 78 can vary in correspondence with the wavelength of radiation used to pattern the second photoresist layer 78. The second photoresist layer 78 may be formed over the conductive, layer 76 via conventional spin-coating or spin casting deposition techniques. The second photoresist layer 78 has a thickness suitable for functioning as a mask for etching the underlying conductive layer 76 and for forming patterns or openings in the developed second photoresist layer 78.

Figure 10:
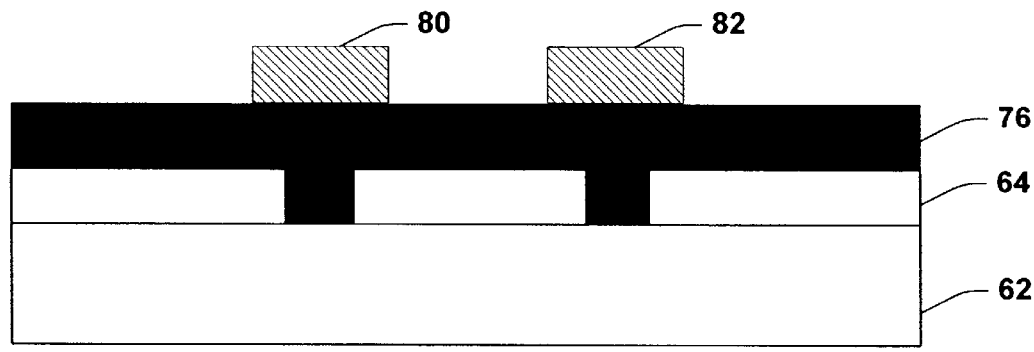
FIG. 10 is a schematic illustration of the structure of FIG. 9 after the second photoresist layer has been patterned in accordance with the present invention.
Figure 11:
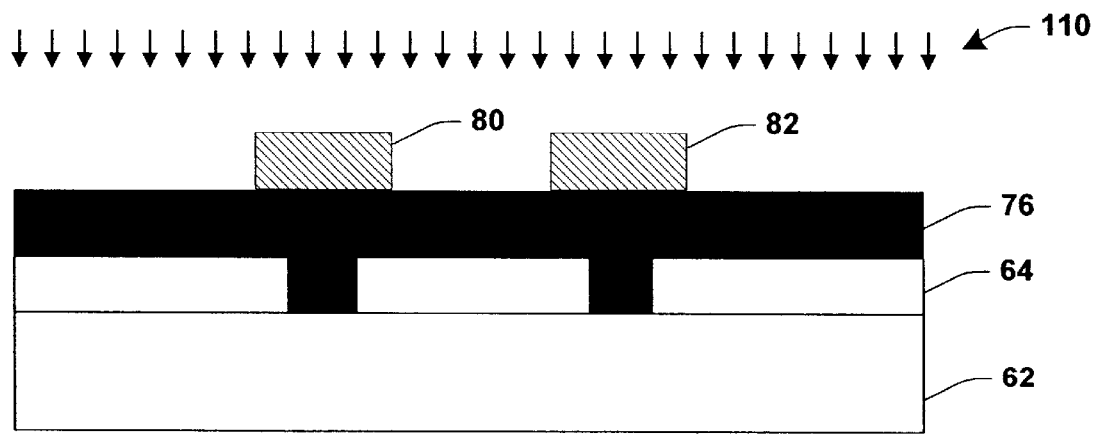
FIG. 11 is a schematic illustration of the structure of FIG. 10 undergoing a second etching step in accordance with the present invention.

The second photoresist layer 78 is patterned using conventional techniques to eliminate photoresist material around the vias 72 and 74 to form a first contact area 80 and a second contact area 82 (FIG. 10). The size of the first contact area 80 and the second contact area 82 is larger than the size of the vias 72 and 74 formed in the oxide layer 64. The second patterned photoresist 78 serves as an etch mask layer for processing or etching the underlying conductive layer 76.

Figure 12:
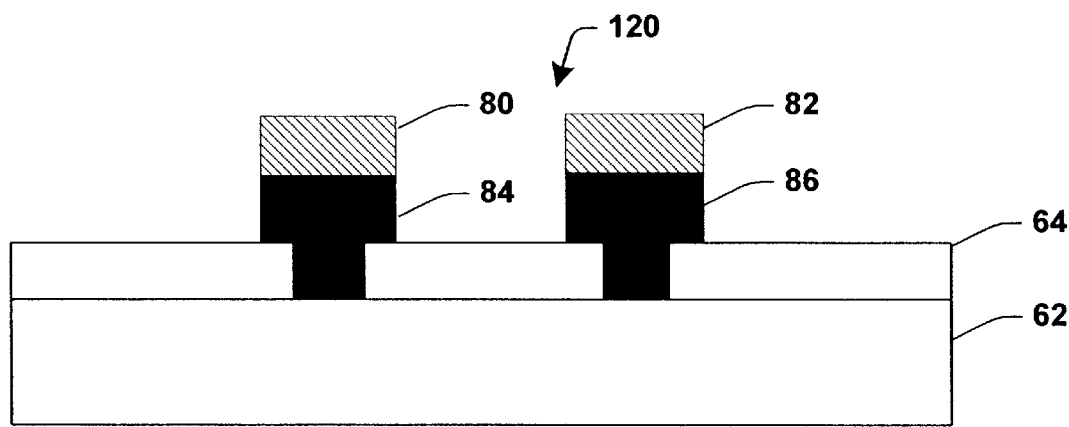
FIG. 12 is a schematic illustration of the structure of FIG. 11 after the second etching step is substantially complete in accordance with the present invention.

An etch step 110 (e.g., anisotropic reactive ion etching (RIE)) (FIG. 11) is performed to form a first contact 84 and a second conduct 86 in the material layer 76. The resultant structure is illustrated in FIG. 12. The second patterned photoresist 78 is used as a mask for selectively etching the material layer 76 to provide a patterned material layer 76. Any suitable etch technique may be used to etch the material layer 76. Preferably, a selective etch technique may be used to etch the material layer 76 at a relatively greater rate as compared to the rate that the material of the second patterned photoresist 78 is etched. The etch step 110 is also highly selective to the material layer 76 over the underlying insulating layer 64, so as to mitigate damage to the insulating layer 64.

Figure 13:
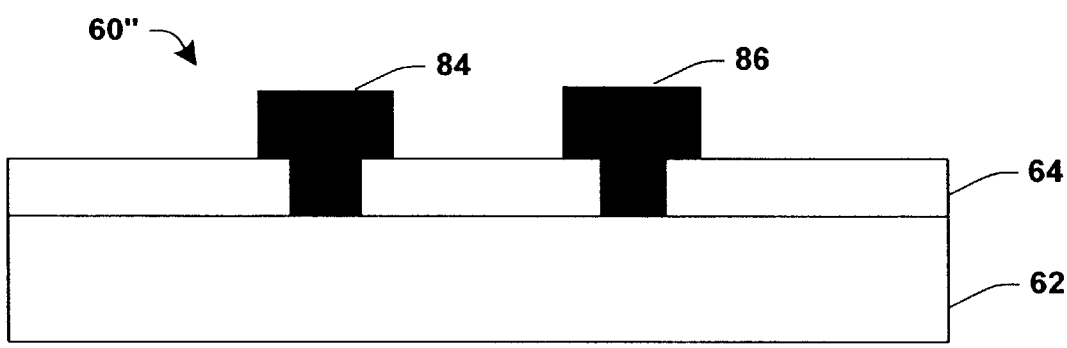
FIG. 13 is a schematic illustration of the structure of FIG. 12 undergoing a stripping step to remove excess photoresist in accordance with the present invention.

FIG. 12 also illustrates a stripping step 120 (e.g., ashing in an $O_2$ plasma) to remove remaining portions of the photoresist layer 78. FIG. 13 illustrates a complete partial reference wafer 60" after the stripping step 120 is substantially complete. The reference wafer 60" includes the first contact 84 and the second contact 86 electrically coupled to the semiconductor substrate 62.

Although the present invention has been described primarily within the context of lines, it is to be appreciated that the present invention is intended to apply to any feature suitable for carrying out the present invention.

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method for calibrating a line width measurement metrology tool set over time, comprising:

using a reference wafer to calibrate a first tool set at a first time period, the reference wafer, including a substrate layer, an insulating layer formed over the substrate layer, a feature formed over the insulating layer, and at least one conductive path coupling at least a portion of the feature to the substrate layer, the at least one conductive path providing a path to dissipate charge from the at least a portion of the feature to the substrate layer, the substrate layer acting as a ground for the reference wafer;

using data obtained from the reference wafer to calibrate the first tool set at a second time period; and using the data obtained from the reference wafer to calibrate a plurality of tool sets, wherein the calibration data for each tool set can be used to cross-reference each tool set with respect to the others.

2. The method of claim 1, wherein the feature comprises polysilicon, the insulating layer is an oxide and the substrate is silicon.

3. A method for calibrating a first and a second metrology tools, comprising:

using a reference wafer to calibrate the first tool, the reference wafer, including a substrate layer, an insulating layer formed over the substrate layer, a pattern formed over the insulating layer, and at least one conductive path coupling at least a portion of the pattern to the substrate layer, the at least one conductive path providing a path to dissipate charge from the at least a portion of the pattern to the substrate layer, the substrate layer acting as a ground for the reference wafer; and using data obtained from the reference wafer to calibrate the second tool at a second time period.

4. The method of claim 3, wherein the pattern is polysilicon, the insulating layer is an oxide and the substrate is silicon.

5. An SEM system comprising:

a plurality of tool sets comprising at least one line width measurement metrology tool set;

a reference wafer adapted to be used to calibrate the line width measurement metrology tool set using data obtained from the reference wafer, the reference wafer having a silicon layer, an insulating layer above the silicon layer and at least one contact, the contact extending from the top of the silicon layer to above the top of the insulating layer;

a metrology system adapted to transmit an electron beam to the reference wafer and detect secondary electron emissions based on characteristics of the reference wafer, wherein the electron beam is transmitted from the metrology system and thereby making contact with the at least one contact forms a charge on the at least one contact that dissipates through the silicon layer; and one or more detectors and one more electron detectors coupled to the metrology system, wherein the one or more detectors is used to calibrate the one or more electron detectors by receiving secondary electron emissions to facilitate obtaining separate calibration data for the plurality of tool sets in order to cross-reference the plurality of tool sets with respect to each other.

6. The system of claim 5, wherein the pattern is polysilicon, the insulating layer is an oxide and the substrate is silicon.

7. The system of claim 5, wherein the at least one contact is one of a polysilicon and a metal.

8. A method for calibrating a line width measurement metrology tool set comprising:

providing a reference wafer adapted to be used to calibrate the line width measurement metrology tool set, the reference wafer having a silicon layer, an insulating layer above the silicon layer and at least one contact, the contact extending from the top of the silicon layer to above the top of the insulating layer;

providing a metrology system comprising one or more detectors and adapted to transmit an electron beam to the reference wafer and detect secondary electron emissions based on characteristics of the reference wafer wherein the electron beam transmitted from the metrology system and making contact with the at least one contact forms a charge on the at least one contact that dissipates through the silicon layer, the silicon layer acting as a ground for the reference wafer;

providing a line width measurement metrology tool set coupled to the metrology system, wherein the line width tool set comprises at least one electron detector, and wherein the one or more detectors of the metrology system is used to calibrate the one or more electron detectors to facilitate obtaining separate calibration data for additional tool sets in order to cross-reference the line width measurement metrology tool set with respect to other tool sets;

transmitting an electron beam to the reference wafer from the metrology system;

measuring the secondary electron emissions from the reference wafer and generating calibration data based on the characteristics of the reference wafer detected from the secondary electron emissions;

adjusting the line width measurement metrology tool set based on the reference calibration data; and cross-referencing the separate calibration data from the line width measurement metrology tool set with respect to other tool sets.

9. The method of claim 8, wherein the pattern is polysilicon, the insulating layer is an oxide and the substrate is silicon.

10. The method of claim 8, further including an ion implantation step to enhance the electron conductivity of the silicon layer.

\* \* \* \* \*